United States Patent [19]

Nelson

[11] Patent Number: 5,339,214

[45] Date of Patent: Aug. 16, 1994

[54] MULTIPLE-FAN MICROPROCESSOR COOLING THROUGH A FINNED HEAT PIPE

[75] Inventor: Daryl Nelson, Beaverton, Oreg.

[73] Assignee: Intel Corporation, Santa Clara, Calif.

[21] Appl. No.: 16,843

[22] Filed: Feb. 12, 1993

[51] Int. Cl.⁵ .................................................. H05K 7/20
[52] U.S. Cl. ................................. 361/695; 165/104.33; 174/15.2
[58] Field of Search ........................ 165/104.22, 104.33, 165/122; 361/381-389, 395, 399, 380; 174/15.2

[56] References Cited

U.S. PATENT DOCUMENTS

| | | |
|---|---|---|
| 3,741,292 | 6/1973 | Aakalu et al. . |
| 3,807,493 | 4/1974 | Stewart . |
| 3,817,321 | 6/1974 | von Cube et al. . |
| 3,829,740 | 8/1974 | Beasley . |
| 3,942,586 | 3/1976 | Fries . |
| 4,019,098 | 4/1977 | McCready et al. . |
| 4,104,700 | 8/1978 | Hutchison et al. ............ 361/384 |
| 4,139,692 | 2/1979 | Meeker et al. . |
| 4,203,129 | 5/1980 | Oktay et al. . |
| 4,204,246 | 5/1980 | Arii et al. . |
| 4,327,399 | 4/1982 | Sasaki et al. . |
| 4,366,526 | 12/1982 | Lijoi et al. . |
| 4,449,576 | 5/1984 | Baum et al. . |
| 4,503,483 | 3/1985 | Basiulis . |
| 4,558,395 | 12/1985 | Yamada et al. . |
| 4,561,040 | 12/1985 | Eastman et al. . |
| 4,588,023 | 5/1986 | Manekawa . |
| 4,600,050 | 7/1986 | Noren . |
| 4,633,371 | 12/1986 | Nagy et al. . |
| 4,644,385 | 2/1987 | Nakanishi et al. . |
| 4,768,581 | 9/1988 | Gotwald et al. . |
| 4,793,405 | 12/1988 | Diggelmann et al. . |
| 4,830,100 | 5/1989 | Kato et al. . |
| 4,870,477 | 9/1989 | Nakanishi et al. . |
| 4,894,749 | 1/1990 | Elko et al. . |
| 4,909,315 | 3/1990 | Nelson et al. . |
| 4,920,574 | 4/1990 | Yamamoto et al. . |
| 4,933,747 | 6/1990 | Schroeder . |
| 4,951,740 | 8/1990 | Peterson et al. . |
| 4,995,451 | 2/1991 | Hamburgen . |
| 5,001,548 | 3/1991 | Iversen . |
| 5,063,475 | 11/1991 | Balan . |

*Primary Examiner*—Gregory D. Thompson
*Attorney, Agent, or Firm*—Blakely Sokoloff Taylor & Zafman

[57] ABSTRACT

A computer chassis assembly that includes a heat pipe which thermally couples an electronic package to multiple fan units. The heat pipe provides a computer chassis that sufficiently cools internal heat generating components without placing the components in close proximity to the fans.

8 Claims, 1 Drawing Sheet

MULTIPLE-FAN MICROPROCESSOR COOLING THROUGH A FINNED HEAT PIPE

BACKGROUND OF THE INVENTION

1. Field of the Invention

The present invention relates to a heat pipe used in a computer assembly.

2. Description of Related Art

Most commercially available computers contain a fan that cools the components of the assembly. The fan is typically located in a wall of the computer chassis and is constructed to induce air flow across the various electronic packages of the computer.

To reduce the junction temperature of the electronic packages, the packages that generate the most heat are preferably located adjacent to the fan. Placing all of the hot components near the fan limits the routing of the printed circuit board and therefore is typically not feasible. Generally speaking, it is desirable to have a computer assembly, wherein the components can be located at any position within the computer chassis. For example, it may be desirable to place the central processing unit (CPU) and associated memory near the floppy and hard disk drives of the system, to reduce the length of the transmission lines between the various components. Having short transmission lines may be essential, particularly if the system operates at high speeds.

The hard and floppy disk drives are usually located on the front wall of the computer, so that the user can readily operate the floppy disk drive. For aesthetic reasons, the fan is typically located on the rear wall of the computer. With such an arrangement the fan must direct air across the entire chassis to cool the components located at the other end of the computer. Blowing air across the chassis reduces the velocity of the air and decreases the heat transfer rate from the electronic packages.

It would therefore be desirable to have a computer chassis with a rearwardly mounted fan that efficiently cools electronic packages located away from the fan. It would also be desirable to have a convection cooling system for a computer that can remove heat without direct contact between the electronic packages and the air stream of the fan, and which can efficiently utilize multiple fan units.

SUMMARY OF THE INVENTION

The present invention is a computer assembly that has a heat pipe which thermally couples an electronic package to a plurality of fans. The assembly includes a chassis that has a baseplate, a front wall and a back wall. Attached to the back wall are fans that are constructed to direct air across the chassis. The electronic package is attached to a mounting plate that is coupled to the baseplate of the chassis. The package is typically located away from the fans and adjacent to the front wall of the chassis.

The heat pipe has an evaporator portion that is adjacent to the package and a condenser portion that is attached to a heat sink that is located in close proximity to the fans. The heat generated by the electronic package is transferred to the heat sink by the heat pipe, and removed from the heat sink by the fans. The present assembly thus allows an electronic package to be cooled by convection without placing the package adjacent to a fans.

Therefore it is an object of the present invention to provide a fan cooled computer assembly which can efficiently cool electronic packages that are not adjacent to the fan of the system, and which can efficiently utilize the cooling potential of additional fans to remove heat from local high heat density areas of the electronic package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
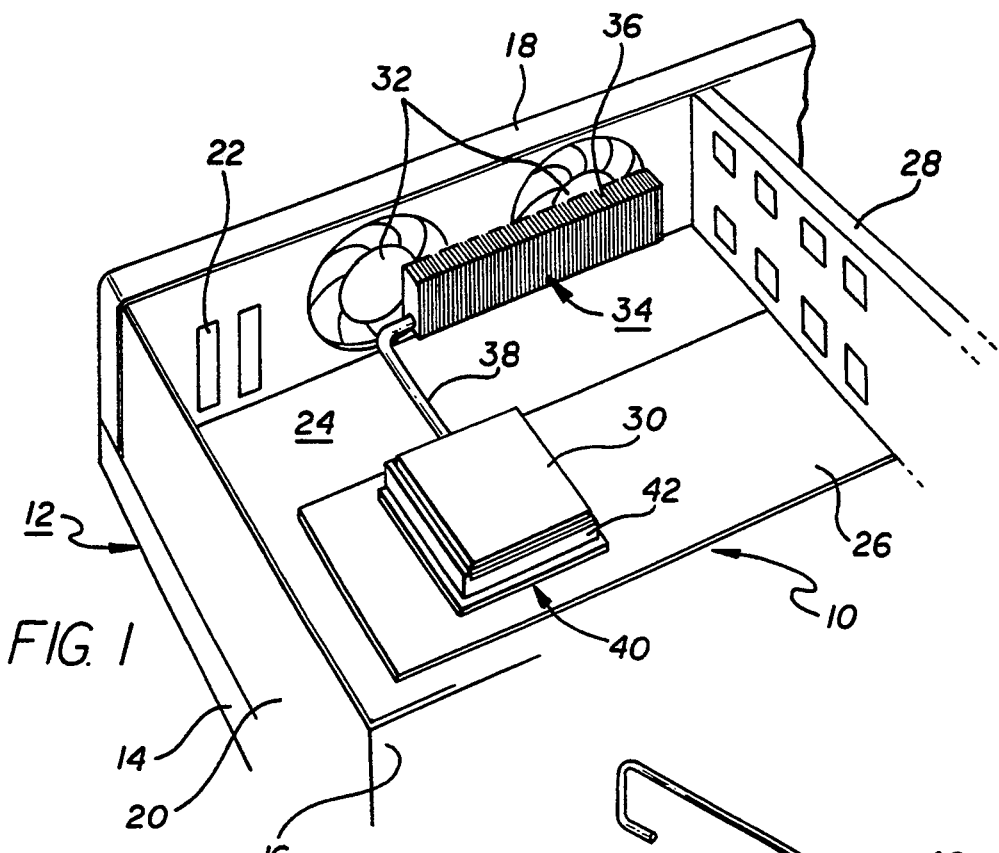
FIG. 1 is a perspective view of a computer assembly of the present invention.

Referring to the drawings more particularly by reference numbers, FIG. 1 shows a computer assembly 10 of the present invention. The computer assembly 10 is typically part of a commercial computer such as a personal computer (PC) or a minicomputer, although it is to be understood that the assembly 10 can be used in other types of systems. The computer 10 includes a chassis 12 which has a baseplate 14 that separates a front wall 16 from a back wall 18. The chassis 12 has a pair of side walls 20 and a plurality of openings 22 which provide access to the internal chamber 24 of the computer. The system typically has a cover (not shown) which can be attached to the walls to encapsulate the internal chamber 24. The computer typically contains a motherboard 26 and a number of electronic card assemblies 28 mounted therein. The card assemblies have a plurality of electrical devices 30. The system may also have a power supply and disk drive assemblies attached to the chassis 12.

Mounted to the back wall 18 of the chassis 12 are a pair of fans 32. The fans 32 are constructed to direct air from the ambient into the internal chamber 24 of the chassis 12. In the preferred embodiment, each fan 32 is typically 40-60 millimeters in diameter and can create an air flow in the range of 9-12 cubic feet per minute (cfm). Although two fans are shown, it is to be understood that more than two fans can be used in the present invention.

Adjacent to the fans 32 is a heat sink 34. The heat sink 34 is typically constructed from an anodized aluminum and contains a plurality of fins 36 that increase the surface area of the member 34. The fins 36 are typically located perpendicular to the fans 32, so that air can readily flow through the heat sink 34. Although a heat sink with a plurality of straight fins is shown, it is to be understood that any type of heat sink and fin arrangement may be used in the present invention.

The assembly includes a heat pipe 38 that extends from the heat sink 34 to a clamping assembly 40. The heat pipe 38 is constructed to transfer heat from the assembly 40 to the heat sink 34. The heat pipe 38 typically contains a fluid that flows along a wick (not shown) attached to the inner surface of the pipe. Heat is applied to an evaporation portion of the pipe 38 that is adjacent to the assembly 40 and removed from a condensation portion of the pipe 38 that is coupled to the heat sink 34. The heat vaporizes the fluid which creates a pressure differential between the evaporation portion and the condensation portion of the pipe 38. The pressure differential pumps the fluid through the wick from the condensation portion to the evaporation portion. The vaporized fluid is then pumped from the evaporation portion back to the condensation portion.

In the preferred embodiment, the heat pipe 38 is constructed from a 0.25 inch diameter copper tube that contains water. The heat pipe 38 may be up to 10 inches long and have a 90° bend to accommodate package locations which are not in-line with the fans 32. The heat sink 34 is preferably attached to approximately 4 inches of the heat pipe 38. It has been found that such a system can produce a thermal resistance of approximately 1.0 centigrades per watt (C/W) between the package 30 and the air of the internal chamber 24.

The computer assembly 10 provides a convection cooling system that can cool electrical components without placing the parts in-line or in close proximity to the fan. Such a system allows the designer to place any integrated circuit (IC) package at any location on the motherboard or card assemblies within the chassis. For example, the system CPU can be placed next to the front wall of the chassis, away from the air streams of the fans. Additionally, another package or electronic assembly can be placed between the fans and package 30 without effecting the thermal performance of the system. For example, a hard disk drive unit may be placed above the electronic package 30. Additionally, an electronic card can be placed between the electronic package and fan, so that the airstream generated by the fan does not flow across the package 30.

Figure 2:
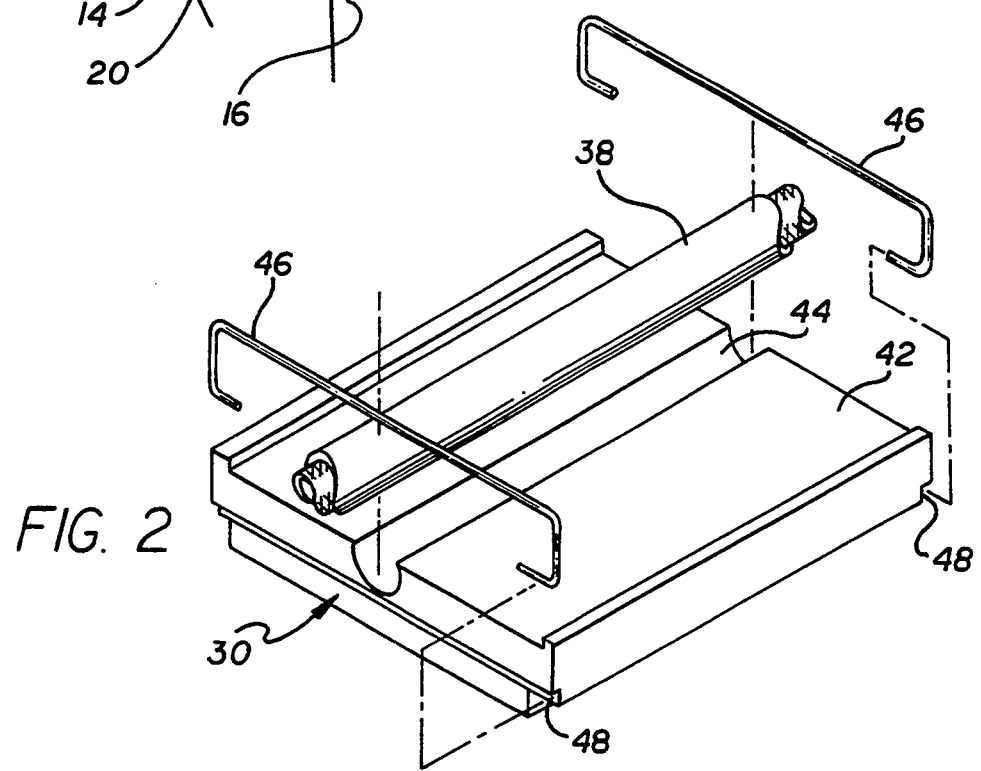
FIG. 2 is an exploded view of a heat pipe clamping assembly.
Figure 3:
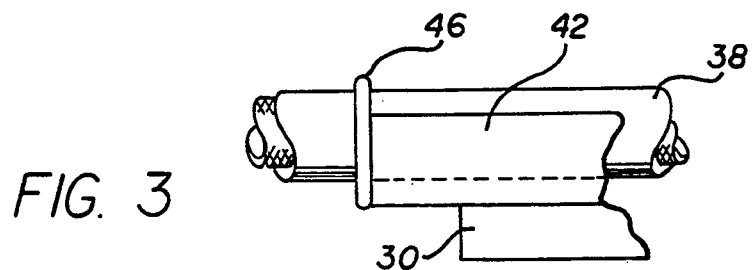
FIG. 3 is a side view of the clamping assembly of FIG. 2.

FIG. 2 shows a preferred embodiment for coupling the package 30 to the evaporation portion of the heat pipe 38. The assembly 10 includes a mounting plate 42 which has radial channel 44 formed therein. The channel 44 is adapted to hold the heat pipe 38. The heat pipe 38 is secured to the mounting plate 42 by a pair of clips 46 which are captured by a pair of grooves 48 located at the ends of the plate 42. The heat generating electronic devices 30 are mounted to the surface of the plate opposite the heat pipe 38. The heat generated by the device 30 flows through the mounting plate 42 and into the evaporation portion of the heat pipe 38. A thermal grease can be placed between the pipe 38 and plate 42 to reduce the thermal resistance between the two members.

In the preferred embodiment, the fins 36 are attached directly to the condensation portion of the heat pipe 38 by soldering, brazing or other similar attachment means. In the alternative, the heat sink 38 may be attached to the heat pipe 38 with a mounting plate as described above. Although one package is shown, it is to be understood that a plurality of packages can be mounted to the mounting plate 42. Similarly, additional heat pipes 38, heat sinks 34, mounting plates 42 and devices 30 can be added to the assembly of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A computer assembly, comprising:
    a chassis having a baseplate and a back wall;
    a first fan attached to said back wall;
    a second fan attached to said back wall;
    a heat sink that is coupled to said chassis adjacent to said first and second fans;
    a first electronic package coupled to said baseplate and separated from said first and second fans by said heat sink, said first electronic package being capable of generating head; and,
    a heat pipe coupled to said first electronic package and said heat sink, said heat pipe being adapted to transfer heat from said first electronic package to said heat sink.

2. The assembly as recited in claim 1, wherein said heat pipe has an elbow.

3. The assembly as recited in claim 1, further comprising a mounting plate located between said heat pipe to said first electronic package.

4. The assembly as recited in claim 1, wherein said first and second fans each create a flowrate that is not greater than 12 cubic feet per minute.

5. A computer assembly, comprising:
    a chassis having a baseplate and a back wall;
    a first fan attached to said back wall, said first fan being adapted to generate a stream of air;
    a heat sink that is coupled to said chassis and has a plurality of fins that are adjacent to said first fan such that said stream of air flows across said fins;
    a mounting plated coupled to said chassis, said mounting plate having a first side and an opposite second side;
    a first electronic package mounted to said first side of said mounting plate, said first electronic package being capable of generating heat;
    a heat pipe mounted to said second side of said mounting plate, said heat pipe being adapted to transfer heat from said first electronic package to said heat sink.

6. The assembly as recited in claim 5, wherein said heat pipe has an elbow.

7. The assembly as recited in claim 5, further comprising a second fan attached to said side wall and adjacent to said heat sink.

8. The assembly as recited in claim 7, wherein said first and second fans each create a flowrate that is not greater than cubic 12 feet per minute.

* * * * *